United States Patent
Snyder

Patent No.: US 6,355,927 B1
Date of Patent: Mar. 12, 2002

(54) INTERPOLATION METHODS AND CIRCUITS FOR INCREASING THE RESOLUTION OF OPTICAL ENCODERS

(75) Inventor: Tanya J. Snyder, Edina, MN (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/378,191

(22) Filed: Aug. 20, 1999

(51) Int. Cl.[7] .............................. G01D 5/34; H01J 40/14
(52) U.S. Cl. .............................. 250/231.13; 250/214 R; 327/514
(58) Field of Search .................. 250/231.13, 231.14, 250/231.16, 231.17, 231.18, 214 R, 214 A; 341/9, 11, 13; 327/3, 12, 63, 64, 514, 515; 340/658

(56) References Cited

U.S. PATENT DOCUMENTS

| 3,675,238 A | 7/1972 | Butscher | 327/75 |
| 4,691,101 A | 9/1987 | Leonard | 250/231.16 |
| 4,904,861 A | 2/1990 | Epstein et al. | 250/214 C |
| 5,844,814 A | 12/1998 | Chilwnyj et al. | 364/559 |
| 5,907,298 A | 5/1999 | Kiriyama et al. | 341/111 |
| 6,191,415 B1 * | 2/2001 | Stridsberg | 250/231.13 |

* cited by examiner

Primary Examiner—Stephone B. Allen
Assistant Examiner—Kevin Pyo

(57) ABSTRACT

An interpolation circuit for an optical encoder or other sensing device includes a signal generating circuit, a comparator circuit and a logic circuit. The signal generating circuit generates A, A', B, B', one or more fractional A or A' and one or more fractional B or B' ramp signals in response to input ramp signals that are one quarter cycle out of phase. The comparator circuit compares selected pairs of the A, A', B, B', one or more fractional A or A' and one or more fractional B or B' ramp signals and generates intermediate signals. The phases of the intermediate signals are preferably uniformly or nearly uniformly distributed in phase with respect to the ramp signals. The logic circuit combines the intermediate signals and provides first and second output signals, each having multiple cycles of the ramp signals. In one embodiment, the signal generating circuit generates A, A', B, B', A/3 or A'/3 and B/3 or B'/3 ramp signals. The logic circuit provides first and second output signals having a total of 16 states, thereby providing a resolution of 16 states for each cycle of the ramp signals.

18 Claims, 7 Drawing Sheets

INTERPOLATION METHODS AND CIRCUITS FOR INCREASING THE RESOLUTION OF OPTICAL ENCODERS

FIELD OF THE INVENTION

This invention relates to optical encoders and other sensing devices and, more particularly, to interpolation methods and circuits for increasing the resolution of optical encoders and other sensing devices.

BACKGROUND OF THE INVENTION

Conventional optical encoders translate the rotary motion of a shaft into a digital output. Shaft position can be determined from the digital output. A prior art optical encoder, as shown in FIG. 1, includes an emitter 10, a detector 12 and a code wheel 16 positioned between emitter 10 and detector 12. Emitter 10 includes a light emitting diode (LED) 20 and a lens 22 which collimates the light emitted by LED 20 into a parallel light beam 24. Detector 12 includes multiple sets of photodiodes 26 and signal processing circuitry 30 for processing the outputs of photodiodes 26.

Code wheel 16, which has a pattern of transparent spaces 32 and opaque bars 34, rotates between emitter 10 and detector 12. The light beam 24 is interrupted by the pattern of spaces and bars on the code wheel 16. The photodiodes 26 which detect these interruptions are arranged in a pattern that corresponds to the radius and design of the code wheel 16. The photodiodes 26 are also spaced such that a light period on one pair of detectors corresponds to a dark period on an adjacent pair of detectors.

The photodiode outputs are fed through signal processing circuitry 30, resulting in A, A', B and B' ramp signals, as shown in FIG. 2. The A ramp signal and the B ramp signal are 90 degrees out of phase. The A' ramp signal is 180° out of phase with the A ramp signal, and the B' ramp signal is 180° out of phase with the B ramp signal. A comparator 40 receives the A and A' ramp signals and produces a channel A output signal as shown in FIG. 2. A comparator 42 receives the B and B' ramp signals and produces a channel B output signal as shown in FIG. 2. Index processing circuitry 44 receives inputs from comparators 40 and 42 and a comparator 46, and generates a channel I index pulse. The index pulse provides a reference for the channel A and channel B output signals.

The channel A and channel B output signals are in quadrature, i.e., 90 degrees out of phase. This arrangement produces four states for each code wheel cycle of one space 32 and one bar 34. Detector 12 thus provides a resolution of four states per cycle of the ramp signals.

In some applications, higher resolution is required. One known approach is to digitize the A, A' B and B' ramp signals with an analog-to-digital converter and to process the digitized ramp signals with a digital signal processor. However, this approach is relatively complex and expensive.

Optical encoders are disclosed in U.S. Pat. Nos. 4,691,101 issued Sep. 1, 1987 to Leonard; U.S. Pat. No. 4,904,861 issued Feb. 27, 1990 to Epstein et al; and U.S. Pat. No. 5,844,814 issued Dec. 1, 1998 to Chliwnyj et al. An interpolation circuit for an encoder is disclosed in U.S. Pat. No. 5,907,298 issued May 25, 1999 to Kiriyama et al. However, the known prior art does not disclose interpolation circuits and methods which provide high resolution and which are relatively simple and inexpensive.

Accordingly, it is desirable to provide interpolation methods and circuits for optical encoders and other sensing devices, which provide high resolution and which are relatively simple and inexpensive.

SUMMARY OF THE INVENTION

According to a first aspect of the invention, an interpolation circuit is provided. The interpolation circuit comprises a signal generating circuit, a comparator circuit and a logic circuit. The signal generating circuit generates A, A', B, B', one or more fractional A or A' and one or more fractional B or B' ramp signals in response to input ramp signals that are one quarter cycle out of phase. The comparator circuit compares selected pairs of the A, A', B, B', one or more fractional A or A' and one or more fractional B or B' ramp signals and generates intermediate signals. The phases of the intermediate signals are preferably uniformly or nearly uniformly distributed with respect to the ramp signals. The logic circuit combines the intermediate signals and provides first and second output signals, each having multiple cycles per cycle of the ramp signals. The first and second output signals are shifted in phase relative to each other.

In one embodiment, the signal generating circuit generates A, A', B, B', A/3 or A'/3 and B/3 or B'/3 ramp signals. The comparator circuit generates eight intermediate signals that are uniformly distributed in phase. The logic circuit provides first and second output signals having a total of 16 states, thereby providing a resolution of 16 states for each cycle of the ramp signals.

According to another aspect of the invention, a method is provided for interpolating input ramp signals that are one quarter cycle out of phase. The method comprises the steps of generating A, A', B, B', one or more fractional A or A' and one or more fractional B or B' ramp signals in response to the input ramp signals, comparing selected pairs of the A, A', B, B', one or more fractional A or A' and one or more fractional B or B' ramp signals and generating intermediate signals, and logically combining the intermediate signals to provide first and second output signals, each having multiple cycles per cycle of the ramp signals. The first and second output signals are shifted in phase relative to each other.

The interpolation circuits and methods of the invention may be utilized in an optical encoder comprising a light source for directing a light beam at a moving code wheel to produce a modulated light beam and a photosensor assembly for receiving the modulated light beam and generating photosensor signals. The light beam may be transmitted through the code wheel to the photosensor assembly or may be reflected by the code wheel to the photosensor assembly. The interpolation circuits and methods may be utilized with any sensor that produces ramp signals that are 90 degrees out of phase.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
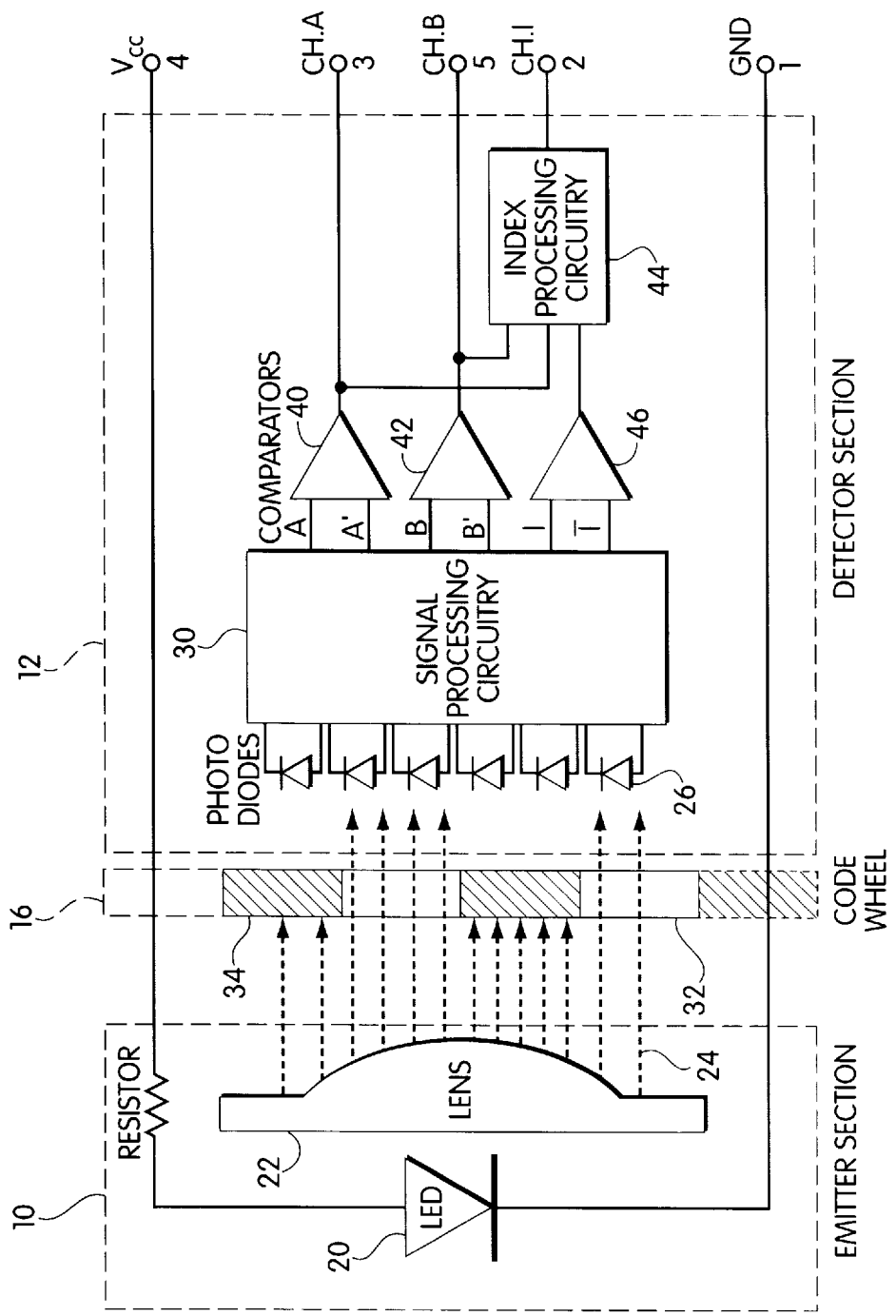
FIG. 1 is a schematic block diagram of a prior art optical encoder.
Figure 2:
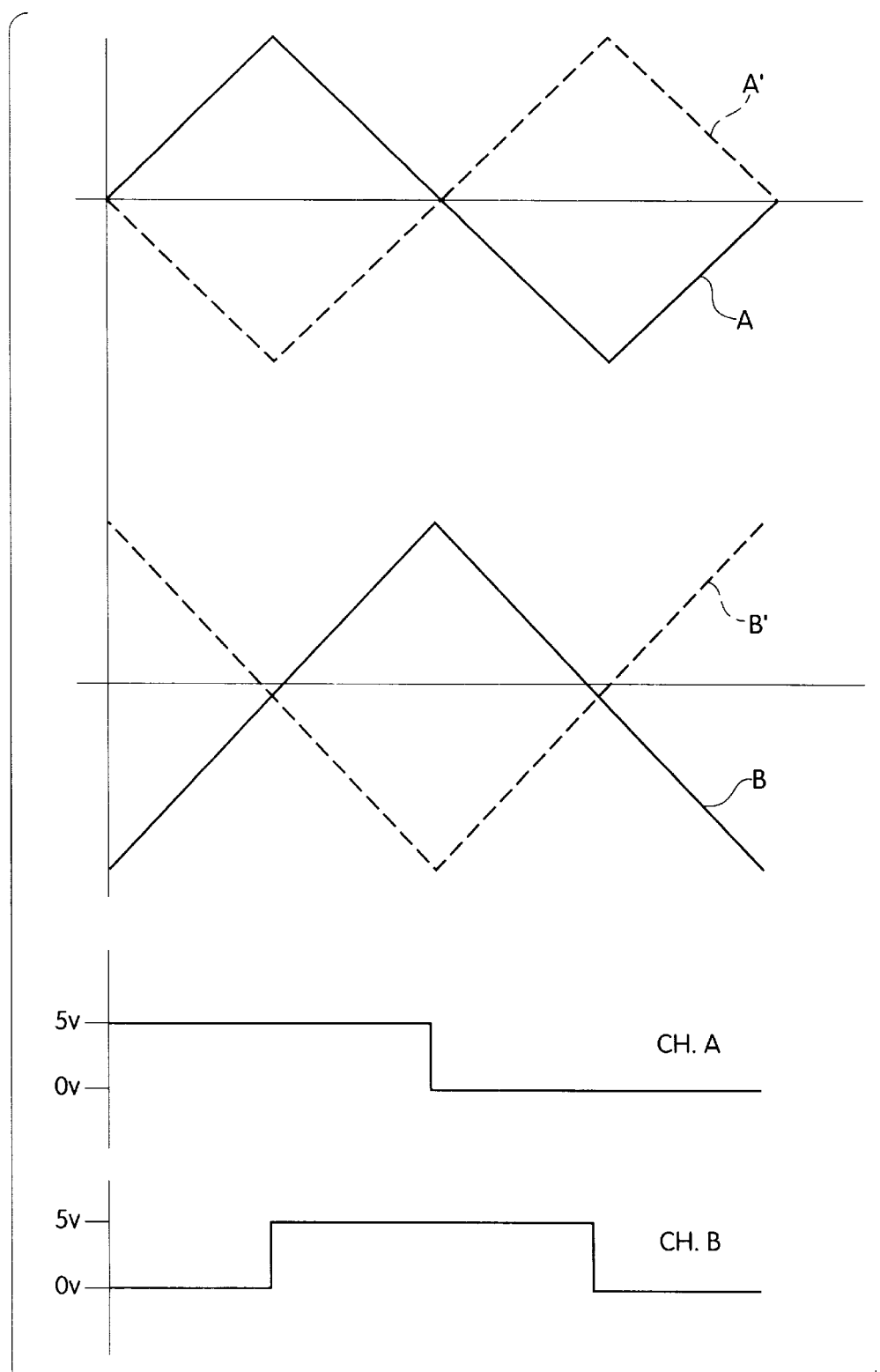
FIG. 2 illustrates waveforms in the optical encoder of FIG. 1.
Figure 3:
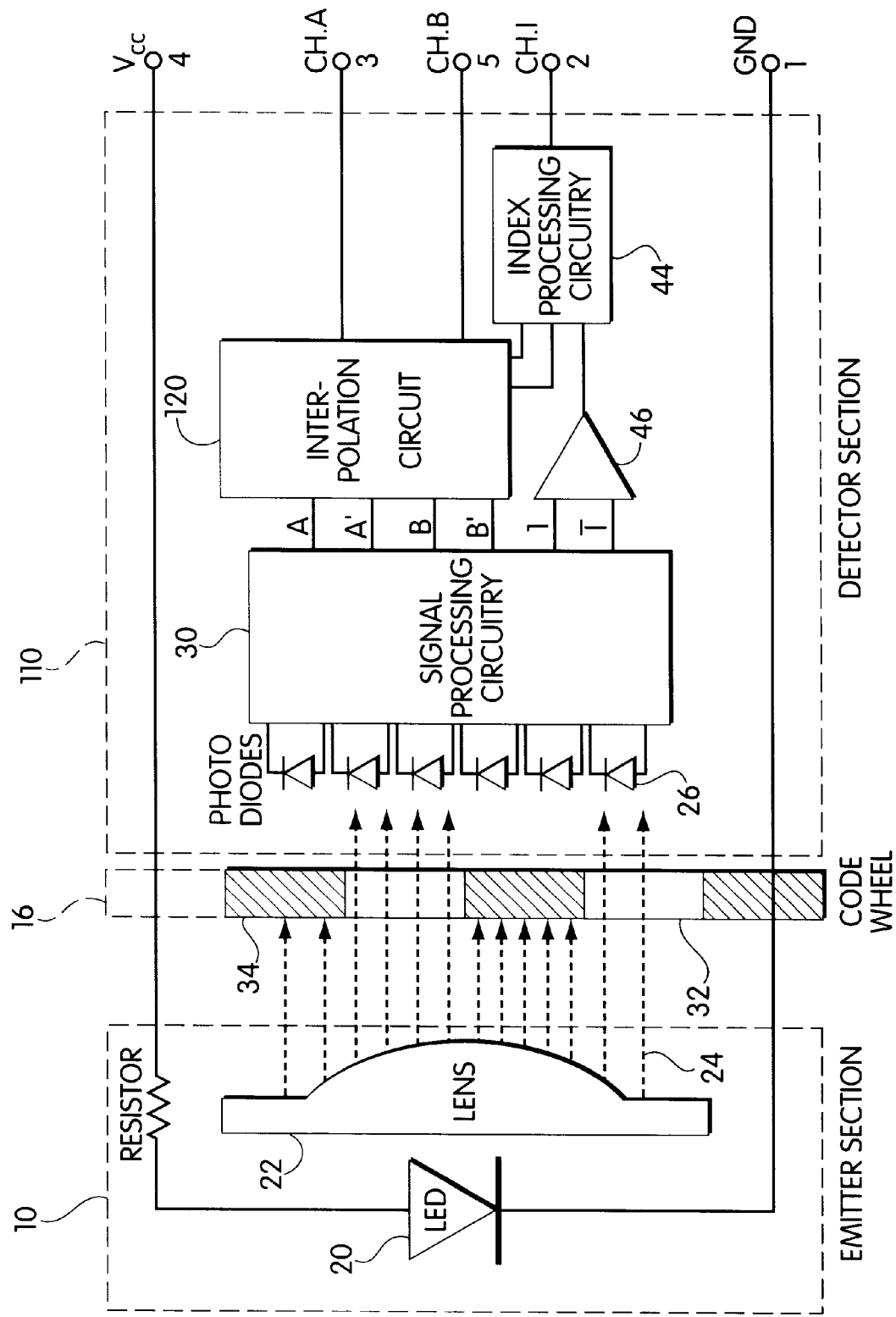
FIG. 3 is an optical encoder in accordance with an embodiment of the invention.

A block diagram of an embodiment of an optical encoder in accordance with the present invention is shown in FIG. 3. Like elements in FIGS. 1 and 3 have the same reference numerals. A detector 110 includes photodiodes 26 and signal processing circuitry 30 as described above. The A, A', B and B' ramp signals are supplied to an interpolation circuit 120. Interpolation circuit 120 provides channel A and channel B output signals as described in detail below. Detector 110 also includes index processing circuitry 44 and comparator 46. Index processing circuitry 44 is not relevant to the present invention and will not be discussed further.

Figure 4:
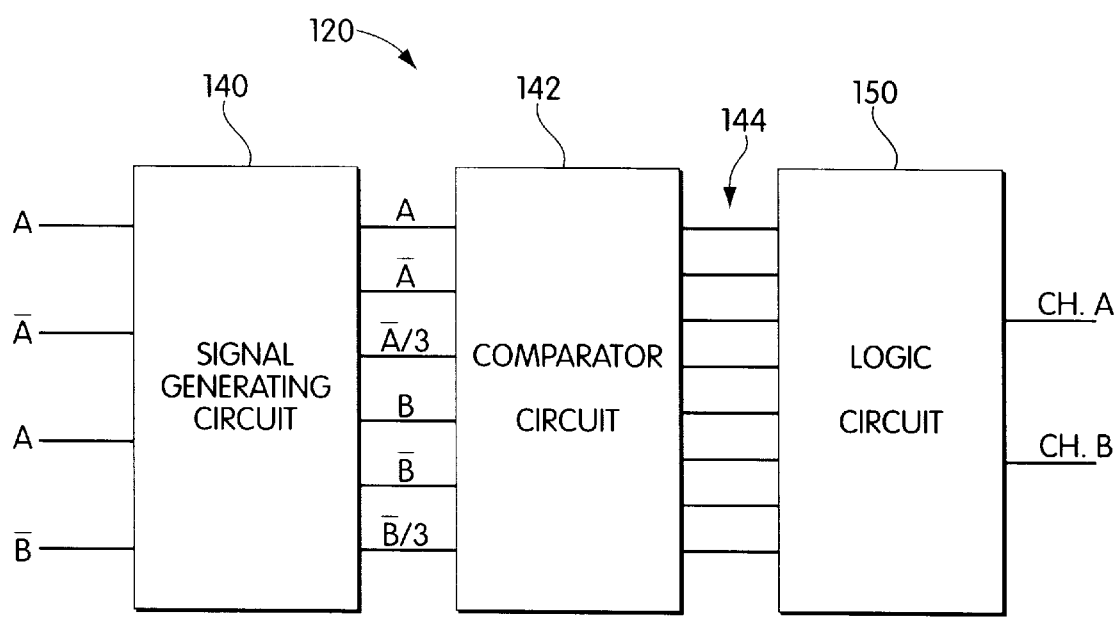
FIG. 4 is a block diagram of the interpolation circuit shown in FIG. 3.

A block diagram of interpolation circuit 120 is shown in FIG. 4. The A, A', B and B' ramp signals are input to a signal generating circuit 140. The signal generating circuit 140 provides A, A', A'/3, B, B', and B'/3 ramp signals to a comparator circuit 142. Comparator circuit 142 compares selected pairs of the A, A', A'/3, B, B', and B'/3 ramp signals and generates a set of eight intermediate signals on lines 144. The intermediate signals are supplied to a logic circuit 150 which combines the intermediate signals and generates channel A and channel B output signals as described below.

Figure 5:
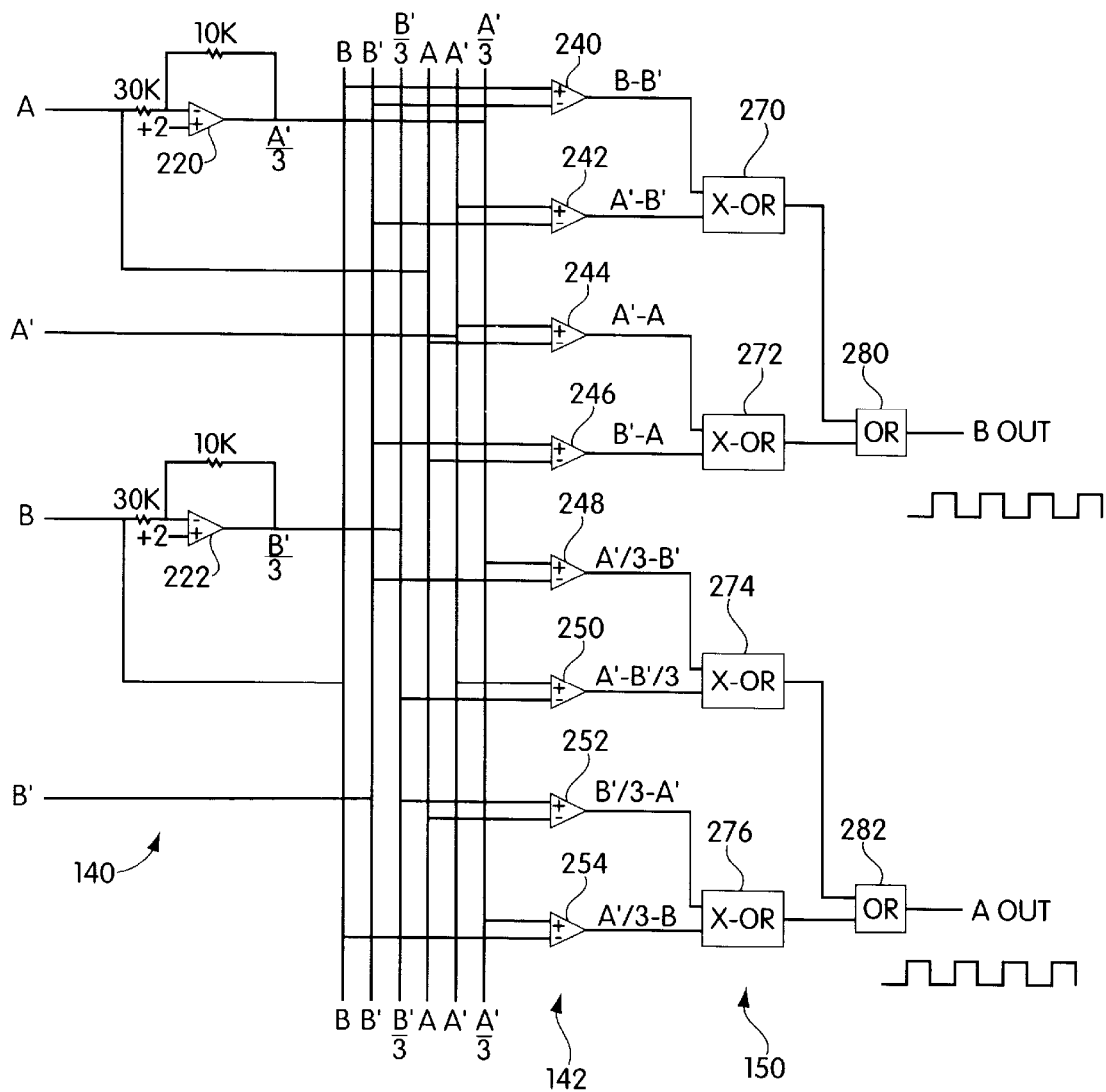
FIG. 5 is a schematic diagram of the interpolation circuit shown in FIGS. 3 and 4.

A schematic diagram of an example of a suitable circuit for implementing interpolation circuit 120 is shown in FIG. 5. Signal generating circuit 140 includes attenuating amplifiers 220 and 222, each having a gain of one third. Amplifier 220 generates the A'/3 ramp signal, and amplifier 222 generates the B'/3 ramp signal. The A, A', B and B' input ramp signals may be scaled if desired. The A' and B' ramp signals may be generated by inverting the A and B ramp signals if desired. However, the A, A', B, B', A'/3 and B'3 ramp signals supplied to comparator circuit 142 should have the amplitude and phase relationships shown in FIG. 6 and described below.

Comparator 142 includes comparators 240, 242, 244, 246, 248, 250, 252 and 254. Each of the comparators compares a selected pair of ramp signals and outputs an intermediate signal. In particular, comparator 240 compares the B and B' ramp signals and generates a B–B' intermediate signal. Similarly, comparator 242 outputs an A'–B' intermediate signal; comparator 244 outputs an A'–A intermediate signal; comparator 246 outputs a B'–A intermediate signal; comparator 248 outputs an A'/3–B' intermediate signal; comparator 250 outputs an A'–B'/3 intermediate signal; comparator 252 outputs a B'/3–A intermediate signal; and comparator 254 outputs an A'/3–B intermediate signals. As described below, the intermediate signals are uniformly distributed in phase for ideal input signals.

Logic circuit 150 includes exclusive OR gates 270, 272, 274 and 276, and OR gates 280 and 282. Exclusive OR gate 270 receives the B–B' and A'–B' intermediate signals and supplies an output to OR gate 280. Exclusive OR gate 272 receives the A'–A and the B'–A intermediate signals and provides an output to OR gate 280. The output of OR gate 280 is the channel B output signal. Exclusive OR gate 274 receives the A'/3–B' and A'–B'/3 intermediate signals and provides an output to OR gate 282. Exclusive OR gate 276 receives the B'/3–A and A'/3–B intermediate signals and provides an output to OR gate 282. The output of OR gate 282 is the channel A output signal.

Figure 6:
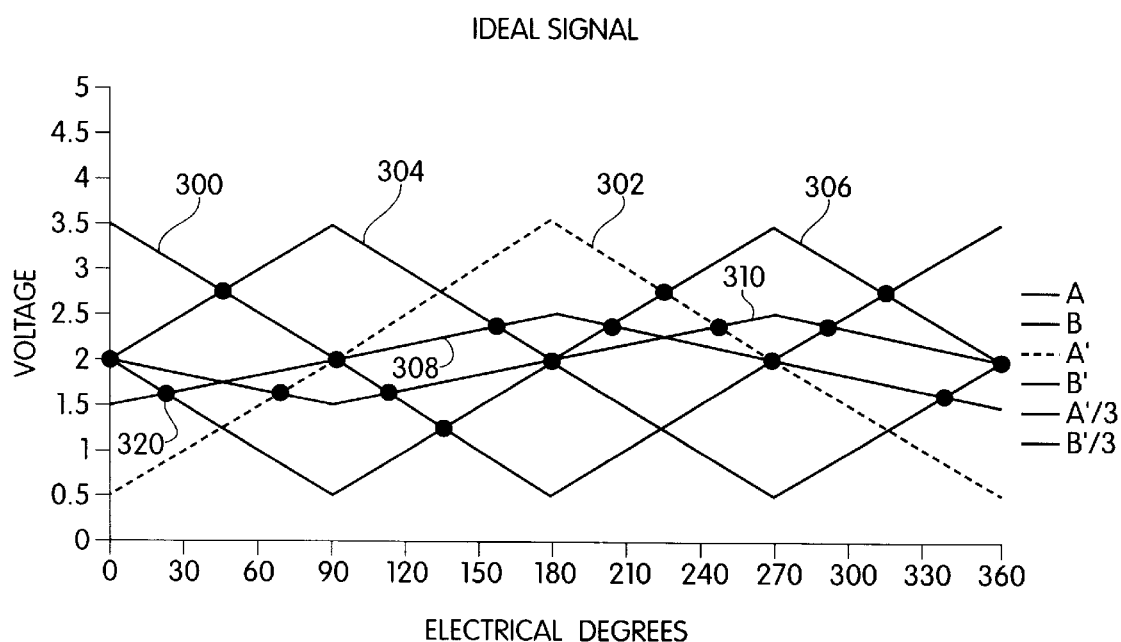
FIG. 6 is a graph of voltage as a function of electrical degrees, illustrating waveforms generated by the signal generating circuit shown in FIGS. 4 and 5.
Figure 7:
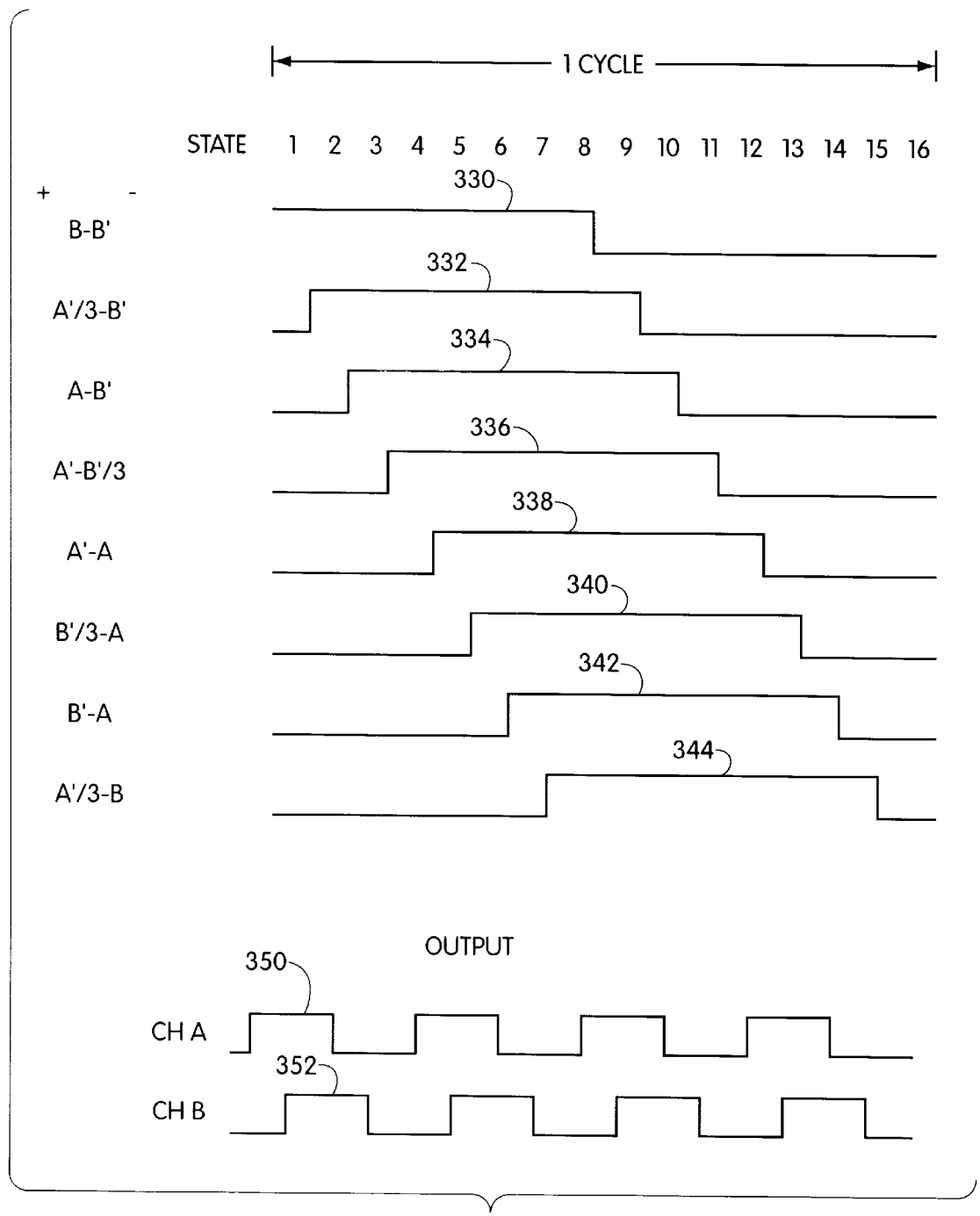
FIG. 7 illustrates waveforms at the output of the comparator circuit and outputs of the logic circuit shown in FIGS. 4 and 5.

Waveforms associated with operation of the interpolation circuit of FIG. 5 are shown in FIGS. 6 and 7. The ramp signals supplied by signal generating circuit 140 are shown in FIG. 6. The ramp signals include the A ramp signal 300, the A' ramp signal 302, the B ramp signal 304, the B' ramp signal 306, the A'/3 ramp signal 308 and the B'/3 ramp signal 310. It may be observed that the A and B ramp signals have equal amplitudes and are 90 degrees out of phase. The A and A' ramp signals are 180 degrees out of phase, and the B and B' ramp signals are 180 degrees out of phase.

In FIG. 6, the crossovers detected by the comparators in comparator circuit 142 are represented by dots, such as dot 320. Dot 320 represents the crossover between the B' ramp signal 306 and the A'/3 ramp signal 308, as detected by comparator 248 in FIG. 5. Other dots represent ramp signal crossovers detected by other comparators in the comparator circuit 142.

The intermediate signals generated by comparator circuit 142 are shown in FIG. 7. The B–B' intermediate signal 330 represents the output of comparator 240. The A'/3–B' intermediate signal 332 represents the output of comparator 248. The A'–B' intermediate signal 334 represents the output of comparator 242. The A'–B'/3 intermediate signal 336 represents the output of comparator 250. The A'–A intermediate signal 338 represents the output of comparator 244. The B'/3–A intermediate signal 340 represents the output of comparator 252. The B'–A intermediate signal 342 represents the output of comparator 246. The A'/3–B intermediate signal 344 represents the output of comparator 254. It may be observed that the intermediate signals 330–344 are phase shifted by equal increments of one sixteenth cycle of the ramp signals. Each of the intermediate signals is a square wave for the case where the ramp signals are ideal ramp signals.

The channel A and channel B output signals of logic circuit 150 are shown in FIG. 7. The channel A output signal 350 is a square wave having four cycles per cycle of the ramp signals. Similarly, channel B output signal 352 is a square wave having four cycles per cycle of the input ramp signals. The channel A and channel B output signals 350 and 352 are one quarter cycle out of phase. Together, the channel A and channel B output signals 350 and 352 have a total of 16 state changes per cycle of the input ramp signals, thus providing a resolution of 16 states per cycle.

The resolution of optical encoders is increased to 16 states per cycle according to the present invention by the addition of the A'/3 and B'/3 ramp signals as illustrated in FIG. 6. The A'/3 and B'/3 ramp signals are called fractional ramp signals because their amplitudes are fractional with respect to the A' and B' ramp signals. The amplitudes of the fractional ramp signals are selected to produce ramp signal crossovers that are uniformly distributed in phase over each cycle of the ramp signals in order to produce a resolution of 16 states per cycle. It may be shown an A/3 or A'/3 ramp signal and a B/3 or B'/3 ramp signal may be utilized.

The resolution of the optical encoder can be increased from 16 states per cycle to 32 states per cycle by the addition of two more fractional ramp signals, and suitable comparators and logic circuitry. In particular, a resolution of 32 states per cycle requires fractional A or A' ramp signals with amplitudes of $1/3$, $3/5$ and $1/7$ and fractional B or B' ramp signals with amplitudes of $1/3$, $3/5$ and $1/7$. In each case, the fractional ramp signals are selected by determining signal slopes which produce ramp signal crossovers that are uniformly distributed in phase over each cycle of the ramp signals. Thus, for a resolution of 16 states per cycle, a ramp signal crossover is required every 22.5 degrees (360/16), and for a resolution of 32 states per cycle, a ramp signal crossover is required every 11.25 degrees (360/32). It will be understood that for higher resolutions, it may be more practical to utilize an analog-to-digital converter and a digital signal processor as described above. However, for moderate resolutions, the present invention provides increased resolution in a relatively simple and low cost circuit.

The invention has been described in connection with an optical encoder which operates with a code wheel attached to a rotating shaft. It will be understood that the present invention is also applicable in a linearly movable coding device which includes a pattern of spaces and bars. The coding device moves through the light beam 24 shown in FIG. 3, thereby generating photosensor signals as in the case of a rotating code wheel. The interpolation circuit of the present invention may be utilized with optical encoders wherein a light beam is transmitted through a code wheel to a detector and with optical encoders wherein a light beam is reflected from a code wheel to a detector that is located on the same side of the code wheel as the emitter. Furthermore the interpolation circuit of the present invention is not limited to use with optical encoders. The interpolation circuit may be used with other sensors, such as magnetic sensors, that produce ramp signals or near ramp signals that are 90 degrees out of phase.

It will be understood that idealized ramp signals are shown in FIG. 6. The idealized ramp signals produce ramp signal crossovers that are uniformly distributed in phase and produce output states that are uniformly distributed in phase. In a practical encoder, the ramp signals may be somewhat non-linear and may differ in amplitude from their idealized values. In this case, the ramp signal crossovers may not be distributed uniformly in phase. However, the encoder may function at a reduced level of accuracy when the ramp signal crossovers are nearly uniformly distributed in phase. Furthermore, the ramp signals may be somewhat rounded near their peaks without adversely impacting the accuracy of the interpolation circuit. As is apparent from FIG. 6, the ramp signal crossovers do not occur near the peaks of the ramp signals. Accordingly, as used herein, the phrase "ramp signals" refers to idealized ramp signals and to nearly idealized ramp signals which, for example, may have rounded peaks.

The signal generating circuit 140 shown in FIG. 5 and described above receives A, A', B and B' ramp signals from signal processing circuitry 30 (FIG. 3). It will be understood that the signal generating circuit 140 may receive different inputs depending on the design of signal processing circuitry 30. In another embodiment, the signal generating circuit generates the required ramp signals based on A and B ramp signals. In yet another embodiment, the signal generating circuit 140 and the signal processing circuitry 30 are combined, so that the required ramp signals are generated directly from the outputs of photodiodes 26 or other sensors.

While there have been shown and described what are at present considered the preferred embodiments of the present invention, it will be obvious to those skilled in the art that various changes and modifications may be made therein without departing from the scope of the invention as defined by the appended claims.

I claim:

1. An interpolation circuit comprising:
    a signal generating circuit responsive to input ramp signals that are one quarter cycle out of phase for generating A, A', B, B', one or more fractional A or A' and one or more fractional B or B' ramp signals;
    a comparator circuit for comparing selected pairs of said A, A', B, B', one or more fractional A or A' and one or more fractional B or B' ramp signals and generating intermediate signals; and
    a logic circuit for combining said intermediate signals and providing first and second output signals each having multiple cycles per cycle of the ramp signals, said first and second output signals being phase shifted relative to each other.

2. An interpolation circuit as defined in claim 1 wherein said signal generating circuit includes means for generating A/3 or A'/3 ramp signals and means for generating B/3 or B'/3 ramp signals.

3. An interpolation circuit as defined in claim 2 wherein said first and second output signals each have four cycles per cycle of the ramp signals and are phase shifted by one quarter cycle relative to each other.

4. An interpolation circuit as defined in claim 2 wherein said comparator circuit generates eight intermediate signals that are uniformly or nearly uniformly distributed in phase with respect to the ramp signals.

5. An interpolation circuit as defined in claim 2 wherein said first and second output signals together have 16 states per cycle of the ramp signals.

6. An interpolation circuit as defined in claim 1 wherein said signal generating circuit includes means for generating an A'/3 ramp signal and a B'/3 ramp signal and wherein said comparator comprises a first comparator for generating a B–B' intermediate signal, a second comparator for generating an A'–B' intermediate signal, a third comparator for generating an A'–A intermediate signal, a fourth comparator for generating a B'–A intermediate signal, a fifth comparator for generating an A'/3–B' intermediate signal, a sixth comparator for generating an A'–B'/3 intermediate signal, a seventh comparator for generating a B'/3–A intermediate signal and an eighth comparator for generating an A'/3–B intermediate signal.

7. An interpolation circuit as defined in claim 6 wherein said logic circuit comprises a first exclusive OR gate for receiving a first pair of said intermediate signals, a second exclusive OR gate for receiving a second pair of said intermediate signals and an OR gate for receiving the outputs of said first and second exclusive OR gates and providing said first output signal, and further includes a third exclusive OR gate for receiving a third pair of said intermediate signals, a fourth exclusive OR gate for receiving a fourth pair of said intermediate signals and a second OR gate for receiving the outputs of said third and fourth exclusive OR gates and providing said second output signal.

8. An interpolation circuit as defined in claim 1 wherein said input ramp signals comprise A, A', B and B' input ramp signals.

9. A method for interpolating input ramp signals that are one quarter cycle out of phase, comprising the steps of:
    generating A, A', B, B', one or more fractional A or A' and one or more fractional B or B' ramp signals in response to the input ramp signals;
    comparing selected pairs of said A, A', B, B', one or more fractional A or A' and one or more fractional B or B' ramp signals and generating intermediate signals; and
    logically combining said intermediate signals and providing first and second output signals, each having multiple cycles per cycle of the ramp signals, said first and second output signals being shifted in phase relative to each other.

10. A method as defined in claim 9 wherein the step of generating ramp signals comprises generating A/3 or A'/3 ramp signals and generating B/3 or B'/3 ramp signals.

11. A method as defined in claim 10 wherein the step of providing first and second output signals comprises providing first and second output signals each having four cycles per cycle of the ramp signals.

12. A method as defined in claim 10 wherein the step of generating intermediate signals comprises generating eight intermediate signals that are uniformly or nearly uniformly distributed in phase with respect to the ramp signals.

13. An optical encoder comprising:
- a light source for directing a light beam at a moving code wheel to produce a modulated light beam;
- a photosensor assembly for receiving the modulated light beam and generating first and second sensor signals, wherein the first and second signals are ramp signals that are one quarter cycle out of phase;
- a signal generating circuit responsive to the first and second sensor signals for generating A, A', B, B', one or more fractional A or A' and one or more fractional B or B' ramp signals;
- a comparator circuit for comparing selected pairs of said A, A', B, B', one or more fractional A or A' and one or more fractional B or B' ramp signals and generating intermediate signals; and
- a logic circuit for combining said intermediate signals and providing first and second output signals, said first and second output signals each having multiple cycles per cycle of the ramp signals and being one quarter cycle out of phase.

14. An optical encoder as defined in claim 13 wherein said signal generating circuit includes means for generating A/3 or A'/3 ramp signals and means for generating B/3 or B'/3 ramp signals.

15. An optical encoder as defined in claim 14 wherein said first and second output signals each have four cycles per cycle of the ramp signals and are phase shifted by one quarter cycle relative to each other.

16. An optical encoder as defined in claim 14 wherein said comparator circuit generates eight intermediate signals that are uniformly or nearly uniformly distributed in phase with respect to the ramp signals.

17. An optical encoder as defined in claim 13 wherein the light beam is directed through the code wheel to produce the modulated light beam.

18. An optical encoder as defined in claim 13 wherein the light beam is reflected from the code wheel to produce the modulated light beam.

* * * * *